United States Patent
Beulens

(10) Patent No.: US 6,209,221 B1
(45) Date of Patent: Apr. 3, 2001

(54) WAFER RACK PROVIDED WITH A GAS DISTRIBUTION DEVICE

(75) Inventor: Sjaak Jacobus Johannes Beulens, Bilthoven (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/312,243

(22) Filed: May 14, 1999

(30) Foreign Application Priority Data

May 14, 1998 (NL) .................................................. 1009171

(51) Int. Cl.[7] .................................................. F26B 21/06
(52) U.S. Cl. .................................. 34/79; 34/103; 34/106; 34/107
(58) Field of Search .................................... 34/72, 77, 78, 34/79, 103, 104, 105, 106, 107, 202, 409, 410, 418, 442, 487; 134/902; 414/222, 225, 226, 939, 940

(56) References Cited

U.S. PATENT DOCUMENTS

| | | |
|---|---|---|
| 4,798,165 | 1/1989 | deBoer et al. . |
| 5,314,509 * | 5/1994 | Kato et al. ............................... 34/406 |
| 5,755,886 * | 5/1998 | Wang et al. ........................... 118/715 |
| 5,784,799 * | 7/1998 | Kato et al. ............................... 34/92 |
| 5,871,811 * | 2/1999 | Wang et al. ....................... 427/248.1 |
| 5,985,041 * | 11/1999 | Florez .................................... 34/78 X |
| 6,003,243 * | 12/1999 | Ohmi ....................................... 34/218 |
| 6,067,728 * | 5/2000 | Farmer et al. ........................ 34/78 X |
| 6,073,366 * | 6/2000 | Aswad ................................... 34/62 X |

FOREIGN PATENT DOCUMENTS

| | | |
|---|---|---|
| 308 946 | 3/1989 | (EP) . |
| 399 616 | 11/1990 | (EP) . |
| 1-137525 | 9/1989 | (JP) . |
| 17969 | 6/1996 | (WO) . |

OTHER PUBLICATIONS

Patent Abstract of Japan, vol. 016, No. 061 (Nov. 15, 1991) JP 03 257167.

Patent Abstract of Japan, vol. 016, No. 526 (Jul. 16, 1992) JP 04 196 522.

Search Report for Netherlands priority application No. 1009171.

* cited by examiner

*Primary Examiner*—Stephen Gravini
(74) *Attorney, Agent, or Firm*—Knobbe, Martens, Olson & Bear, LLP

(57) ABSTRACT

Wafer rack consisting of a carrier frame provided with accommodations for at least two wafers. To provide uniform distribution of gas over said wafers a gas distribution device is fitted at least above each wafer, which gas distribution device is connected to the gas supply for the reactor in which the wafer rack is placed. Connection to such a gas supply can be via coupling of the wafer rack to a part of said reactor.

7 Claims, 2 Drawing Sheets

WAFER RACK PROVIDED WITH A GAS DISTRIBUTION DEVICE

FIELD OF THE INVENTION

The present invention relates to a wafer rack to be placed in a reactor, comprising a carrier frame provided with at least two accommodations for at least two wafers. A wafer rack of this type is generally known in the prior art and is used for batchwise treatment of two or more wafers. The number of wafers that is treated simultaneously can rise to far above 100.

BACKGROUND OF THE INVENTION

Wafers are subjected to various treatments, including chemical treatments in a wide variety of types of reactor. One treatment comprises etching wafers using HF vapour. Because of a wide variety of circumstances, it can be desirable to etch wafers between different deposition treatments. The problem then arises that such an etching substance also has to penetrate into relatively deep wells present in the wafer in order to be able to etch native silicon dioxide. In particular, problems have been detected if a layer of doped oxides deposited using CVD, such as borophosphosilicate glass (BPSG), has to be etched. The methods known in the prior art for etching batches of wafers do not give a uniform result.

This problem increases on increasing the diameter of the wafers. Recently there has been a discernible trend in the market to switch from 200 to 300 mm. If such wafers are etched using conventional techniques, this results in a difference between minimum and maximum etching depth in a range between, for example, 50 Å and 5000 Å. Moreover, it will hardly be possible to remove the native oxides in the mid section of such wafers.

In U.S. Pat. No. 4,798,165, drawn up in the name of ASM International N.V. in Bilthoven, it is proposed, for a reactor in which a single wafer is treated, to supply the gas via a distributor plate arranged above the wafer so that uniform distribution of gas over the wafer is produced. Such a process is satisfactory.

SUMMARY OF THE INVENTION

The aim of the present invention is to achieve the uniform distribution that is obtained with the equipment according to the above mentioned U.S. Pat. No. 4,798,165 for the batchwise treatment of various wafers as well.

This aim is achieved with a wafer rack as described above in that a gas distribution device effective for each accommodation is mounted on the carrier frame, said gas distribution device comprising a distributor plate, provided with at least one opening, for each accommodation as well as gas supply means.

According to the invention a gas distributor plate is arranged at least above each wafer, which gas distributor plate is provided with a large number of openings through which the gas is supplied to the wafer. That is to say feeding of gas no longer takes place from one side of the reactor in an uncontrolled manner towards the opposing side, producing a non-uniform distribution of gas, but a radial gas flow is now produced over each wafer. The invention has been described above with reference to a reactor in which the wafers are placed above one another in a wafer rack extending in the vertical direction. It must be understood that with the necessary modifications the construction according to the invention can also be used for the batchwise treatment of wafers placed vertically in a wafer rack oriented essentially in the horizontal direction.

The gas supply to the gas distribution device can be chosen depending on the design of the construction. If reactors which are still to be produced are taken as the starting point, according to a simple embodiment the wafer rack is provided with feed lines for the gas that is used for treatment or flushing, the inlet thereof being able to engage via a coupling with a corresponding coupling in the reactor. Preferably, coupling is automatically produced by the introduction of the wafer rack. If a wafer rack construction according to the present invention has to be arranged in existing reactors, with which the gas flow takes place from one side to the opposing side, it is preferable so to control the gas flow by fitting gas distributor plates that optimum metering to the distributor plate takes place, whilst provision must be made for directed discharge of the gas.

According to an advantageous embodiment of the invention, in a vertical reactor the gas is supplied at the top of the wafers. However, it is also possible to supply the gas at the bottom, on its own or in combination with the gas supply at the top.

The present invention also relates to a reactor for accommodating a wafer rack and provided with coupling means to produce a connection with a supply line for gas mounted on the wafer rack as described above.

The invention also relates to a method for simultaneous treatment of at least two wafers in a process installation with a gas, comprising placing said wafers in a wafer rack and introducing said filled wafer rack into said process installation, wherein the gas is supplied via a central feed from the reactor separately to, in each case, one chamber above/below the surface of each wafer and is moved over at least said surface of said wafer, uniformly distributed over said wafer.

BRIEF DESCRIPTION OF THE DRAWINGS

The invention will be described in more detail below with reference to illustrative embodiments shown in the drawings. In the drawings:

FIG. 1 shows, highly diagrammatically, a wafer rack according to the invention arranged in a reactor, only part of which is shown;

FIG. 2 shows a perspective and partially exposed view of part of the wafer rack according to FIG. 1; and FIG. 3 shows a further embodiment of the wafer rack arranged in a reactor according to the invention.

DETAILED DESCRIPTION OF THE DRAWINGS

In FIG. 1 the wafer rack according to the invention is indicated in its entirety by 1. A large number of wafers 2 are accommodated in said wafer rack. The wafer rack 1 consists of two uprights 3, located opposite one another, which form the carrier frame. Each of the uprights 3 is provided with support ridges 4 for accommodating the wafers 2 between them. A gas distribution chamber 5 is arranged between every two wafers, which gas distribution chamber is connected on opposing sides to, in each case, one channel 6 in each of the uprights 3. Each gas distribution chamber consists of a top plate 7 and a bottom plate 8, the bottom plate 8 being provided with a large number of openings. A figure of more than 1000 openings and more particularly approximately 1500 openings with a diameter of approximately 0.3 mm is mentioned here by way of non-limiting example. The channels 6 are in communication with one another and emerge in a connection line 10, provided at the end with a coupling 11 equipped to interact with a coupling 12 which is arranged in the upper part 13 of a reactor, of which only the walls 14 are also shown. Such a reactor is, for example, designed for etching oxides on wafers using HF and water vapour. To this end a vacuum of, for example, 16 to 30 torr is maintained in such a reactor, the reactor being flushed with nitrogen. This is a dynamic process with continuous flow. The material from which the wafer rack is made is chosen depending on the process. 'Monel' is outstandingly suitable for the etching process described here. In FIG. 2 the construction shown in FIG. 1 for a single wafer is shown in detail and partially exposed.

Figure 1:
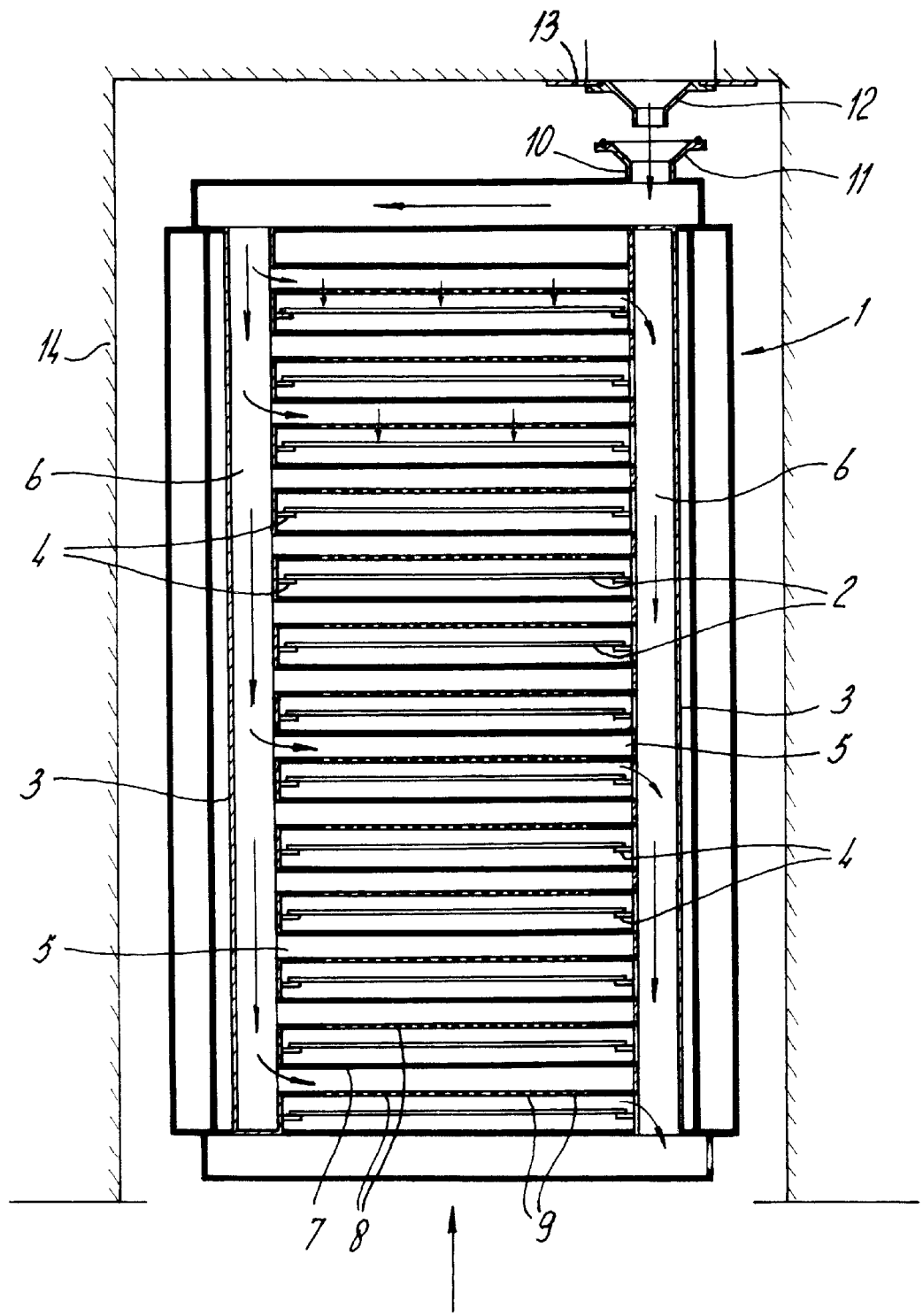
Figure 2:
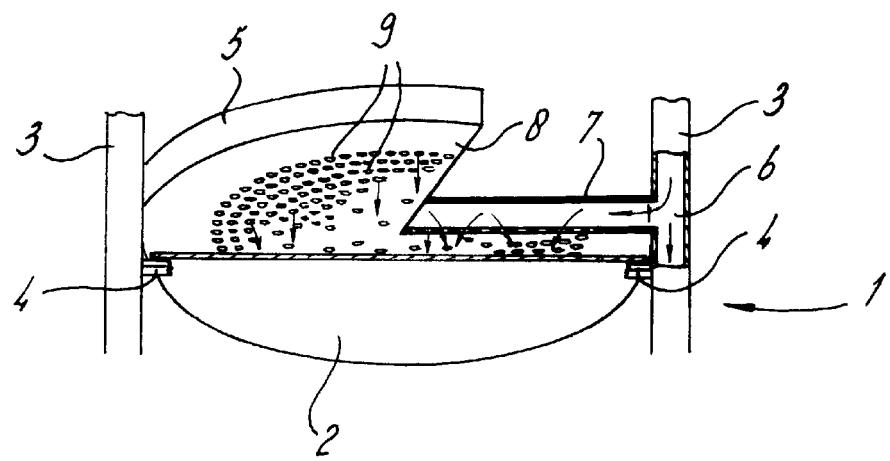

With the installation shown in FIGS. 1 and 2, gas originating from coupling 11, 12 is fed via a connection line 10 to the various top plates and issues through the openings made therein, uniformly distributed over the surface of the wafers, towards the outside. The gas can then be discharged from the reactor in the conventional manner, for example through discharge openings made over the entire height of the reactor around the periphery thereof, which openings are not shown.

Figure 3:
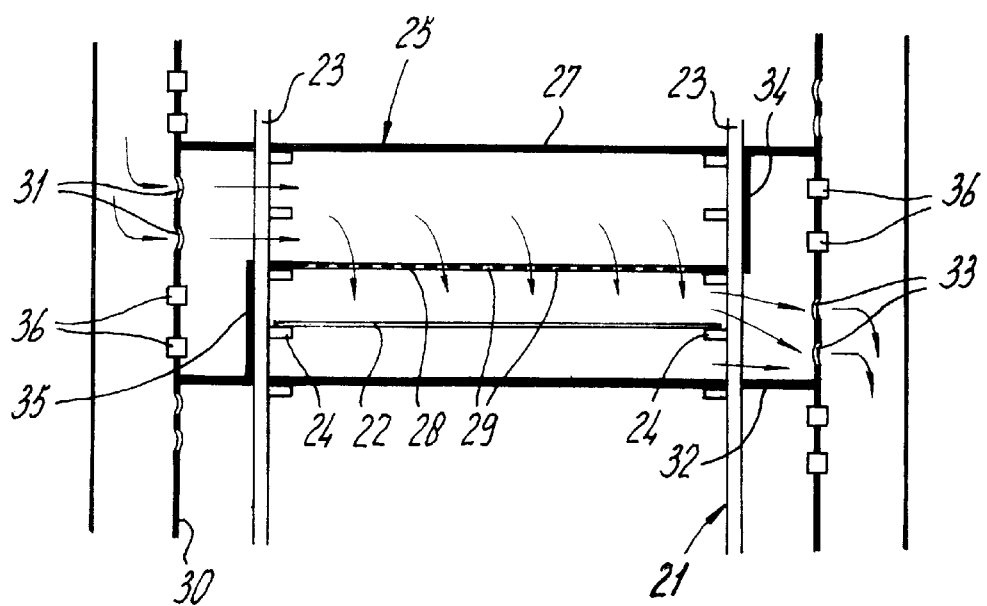

FIG. 3 shows a variant of the invention which in particular can be used for subsequent adaptation of existing reactors. The wafer rack according to the invention is indicated in its entirety by 21 and serves to accommodate a number of wafers 22. Here too the wafer rack consists of two uprights 23 located opposite one another, which form the carrier frame, provided with support ridges 24 for supporting wafers 22 (only one is shown). There is a gas distribution chamber 25, consisting of a top plate 27 and a bottom plate 28. Openings 29 have been made in the bottom plate 28. The vertical furnace walls are indicated by 30 and were originally provided with inlet openings 31 for gas and discharge openings 33 for gas. In the embodiment according to FIG. 3 a number of said existing openings are closed off by plugs 36. In the embodiment shown here measures have to be taken to collect the gas in the gas distribution chamber 25 and to prevent said gas flowing in an uncontrolled manner from openings 31 to 33, from left to right in FIG. 3. After all, in that case non-uniform etching of wafer 22 will take place. End walls 34 and 35 are present to prevent these various aspects. Said walls, together with end plate 32, form an enclosed chamber, so that the gas entering through openings 31 is forced to move through openings 29, uniformly distributed over wafer 22. By means of end plate 32 and top plate 27, the gas is also forced to emerge again via openings 33. In this way an individual treatment chamber for each wafer is produced. A number of such treatment chambers are formed by interaction of the walls described above with the reactor walls 30 after the wafer rack 21 according to the invention has been introduced into the reactor.

On comparing the embodiment according to FIGS. 1 and 2 and that according to FIG. 3 it will be immediately apparent to a person skilled in the art that numerous variants are possible within the scope of the present application, which variants are obvious and fall within the scope of the appended claims.

For instance, it is possible, in particular, to fit further aids for uniform distribution of the gas. This means that blocking and guide plates can be fitted in the gas distribution chamber.

What is claimed is:

1. A reactor-wafer assembly wherein a wafer rack is placed in a reactor, comprising:

a carrier frame having at least two accommodations for at least two wafers;

a gas distribution device effective for each accommodation and mounted on the carrier frame, said gas distribution device comprising for each accommodation a distributor plate, which has at least one opening, and gas supply means;

a feed provided on said reactor for cooling/treatment gas and connected to said wafer rack; and coupling means provided on said reactor and said wafer rack for connecting said wafer rack to said feed at an inlet of said reactor.

2. The reactor-wafer assembly of claim 1, wherein said gas supply means comprise means for directing a gas stream coming from the reactor.

3. The reactor-wafer assembly of claim 2, wherein said means for directing a gas stream comprise a connection line that can be uncoupled from the reactor.

4. The reactor-wafer assembly of claim 1, wherein the wafers are placed horizontally in the reactor, the carrier frame extends essentially vertically around said wafers and said distributor plate is arranged within the peripheral extension of said carrier frame.

5. The reactor-wafer assembly of claim 1, wherein said gas distributor plate is mounted above said wafer accommodations and an outlet plate is mounted beneath said accommodations.

6. The reactor-wafer assembly of claim 1, wherein said gas distributor plate is provided with at least one thousand openings.

7. A wafer rack assembly to be placed in a reactor, comprising:

a carrier frame having a plurality of supports, each support configured to receive a wafer;

a plurality of gas distributor plates mounted on the carrier frame, each gas distributor plate having an inlet for gas and having at least one opening at a surface that faces one of the wafers to distribute gas individually to said wafer;

a gas distribution line coupled to each inlet of each distributor plate and connectable to a feed provided on a reactor to receive cooling/treatment gas and distribute said gas to the distributor plate; and a plurality of outlets, each outlet being assigned to a distributor plate and to a wafer to exhaust gas provided through said at least one opening to said wafer.

* * * * *